(12) United States Patent
Seuntjens

(10) Patent No.: US 6,610,930 B1
(45) Date of Patent: *Aug. 26, 2003

(54) COMPOSITE NOBLE METAL WIRE

(75) Inventor: Jeffrey Michael Seuntjens, Singapore (SG)

(73) Assignee: Kulicke & Soffa Investments, Inc., Wilmington, DE (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/154,417

(22) Filed: Sep. 16, 1998

(51) Int. Cl.$^7$ .................................................. H01R 4/02
(52) U.S. Cl. .................................................. 174/94 R
(58) Field of Search .................. 174/126.2, 128.1, 174/94 R; 219/56.1, 56.21; 439/887; 228/4.5

(56) References Cited

U.S. PATENT DOCUMENTS

| | | | | |
|---|---|---|---|---|
| 3,622,285 A | | 11/1971 | Hayes | 29/199 |
| 4,330,329 A | * | 5/1982 | Hayashi et al. | 420/511 |
| 4,514,589 A | | 4/1985 | Aldinger et al. | 174/119 |
| 4,752,442 A | * | 6/1988 | Asada et al. | 420/507 |
| 4,859,811 A | * | 8/1989 | Sawada et al. | 174/126.2 |
| 4,970,365 A | | 11/1990 | Chalco | 219/121.63 |
| 5,097,100 A | * | 3/1992 | Jackson | 174/94 R |
| 5,231,270 A | | 7/1993 | Groos et al. | 219/69.12 |
| 5,592,732 A | * | 1/1997 | Leuthold et al. | 174/94 R X |
| 5,702,814 A | * | 12/1997 | Hanada et al. | 428/364 |

FOREIGN PATENT DOCUMENTS

| | | |
|---|---|---|
| JP | 57-37405 | 3/1982 |
| JP | 59219819 | 5/1983 |
| JP | 1-255233 | 10/1989 |

OTHER PUBLICATIONS

Brannon, J., Snyder, C., "Pulsed 532 nm Laser Wirestripping: Removal of Dye–Doped Polyurethane Insulation", *Applied Physics, A59, Solids and Surfaces*, 73–78 (1994).

Ray et al., "Ultrasonic Bonding of Wires to Chromium–Copper", *Electron. Compon. Conf., 36th*, 307–311 (1986).

* cited by examiner

*Primary Examiner*—Chau N. Nguyen
(74) *Attorney, Agent, or Firm*—Synnestvedt & Lechner LLP

(57) ABSTRACT

Composite wires in which a noble metal annulus is welded to an electrically-conductive, non-noble metal wire core. Methods of forming the composite wire and semiconductor packaging having at least one lead bonded to the composite wire are also disclosed.

12 Claims, 3 Drawing Sheets ns for finer  bonding wire technology.  
COMPOSITE NOBLE METAL WIRE

BACKGROUND OF THE INVENTION

The present invention relates to composite noble metal wires having an electrically-conductive, non-noble metal-containing core clad with a noble metal annulus. In particular, the present invention relates to composite wires formed by co-extrusion of the non-noble metal-containing core material and the noble metal. The present invention further relates to methods of forming composite wires in which a core containing a non-noble metal is clad with a noble metal annulus by co-extrusion of the non-noble metal core material with noble metal.

Advances in semiconductor packaging towards finer pitches, longer spans, and lower packaging costs are not adequately met by present gold bonding wire technology. The wire modulus, cost and strength requirements dictate the use of a more complex wire material than universally accepted 4N gold alloy.

Future bonding wire may need to conform to requirements of approximately 50 microns pitch at an approximately 5000 micron span, at a wire diameter of 20 microns. Bonding wire sag and sway are concerns in such a configuration. The sway deflection of one wire relative to another must be limited to about 30 microns. The relative strain required to cause a short between adjacent wires is less than 0.005%, which is an elastic strain. 4N gold alloys have an increased modulus over pure gold, but gold-based bonding wire alloys are not expected to have a sufficient modulus for such future requirements.

Copper is an ideal bonding wire in terms of modulus, resistivity, density and cost. However, oxidation concerns and higher bonding costs have prevented copper from becoming a common bonding wire material.

U.S. Pat. No. 5,097,100 discloses a noble metal-plated copper wire. A drawn copper wire having a diameter of from about 44 to 56 microns is electrolytically plated with gold, the surface of which may be cold-drawn to harden the gold layer.

However, it is not possible to uniformly plate a gold layer of adequate purity at a reasonable cost. The gold may not adequately adhere to a copper core by following the disclosure of U.S. Pat. No. 5,097,100. The other metal coating deposition techniques disclosed by this patent, including electroless plating, vapor deposition, sputtering, dipping, and the like are problematic for the same reasons. Furthermore, none of these techniques can coat a copper wire core with a 4N gold alloy bonding wire sheath.

While U.S. Pat. No. 5,097,100 discloses that the copper and gold may be co-drawn, there is no teaching, let alone a working example, of how this may be accomplished with micron dimensioned wires. There remains a need for a composite gold-clad copper wire that is capable of meeting the anticipated future performance requirements of the semiconductor industry at a reasonable cost.

SUMMARY OF THE INVENTION

This need is met by the present invention. It has now been discovered that composite wire having a non-noble metal core of consistent diameter with a noble metal layer of uniform thickness firmly adhered thereto may be economically produced by forming the noble metal layer on a non-noble metal core before the wire is drawn.

Therefore, according to one aspect of the present invention, a composite wire is provided consisting essentially of a wire core containing an electrically-conductive non-noble metal, and a noble metal annulus metallurgically bonded to the wire core.

Copper is the preferred non-noble metal, and a wire core consisting essentially of copper is most preferred. The noble metal is preferably gold, and more preferably gold having a purity greater than 90%. The purity is preferably greater than 99% and even more preferably greater than 99.99%. Preferably, the gold is a gold alloy in which the gold is doped to obtain sound deformation of the gold/copper composite as it is drawn, and good bonding properties for the composite wire, such as, for example, gold doped with less than 30 ppm of calcium, less than 20 ppm of beryllium, and less than 50 ppm of other elements. A particularly preferred alloy is 4N gold.

The present invention provides a method by which a non-noble metal wire may first be coated with a noble metal and then drawn to micron dimensions rather than attempting to form a layer of noble metal on a micron-dimensioned wire. Therefore, according to another aspect of the present invention, a method is provided for forming a micron-dimensioned composite wire consisting essentially of a conductive wire core containing a non-noble metal and a noble metal annulus metallurgically bonded thereto, wherein the method includes:

providing a first composite wire having a diameter between about 0.5 and about 5 millimeters, wherein the first composite wire consists essentially of a core containing a non-noble metal, and a noble metal annulus metallurgically bonded to the core; and drawing the first composite wire to form a second composite wire having a diameter between about 15 and about 75 microns, so that the core fraction measured by cross-sectional area of the second composite wire is essentially the same as the core fraction of the first composite wire.

The first composite wire is drawn from a composite rod produced by co-extrusion of a noble metal billet having a non-noble metal core material thereby metallurgically bonding the noble metal and core metal layers. The composite wire having a diameter of 20 microns is drawn from a composite wire having millimeter dimensions, which in turn is formed from a composite cylindrical rod formed by extrusion of a composite billet, with the relative cross-section of the composite core and noble metal layer remaining unchanged from the billet to the rod to the wire. This permits direct control of the core fraction of the nominally 20 micron diameter composite wire to a degree heretofore unknown. Therefore, according to another aspect of the present invention, a composite wire is provided, having a micron-dimensioned diameter, prepared by the method of the present invention.

In other words, the desired core fraction, for example, for a 20 micron diameter composite wire, is produced by a composite billet having the same relative fraction of core material. By constructing a billet having the fraction of core material desired for the composite wire end product, a micron dimensional composite wire is obtained having the desired fraction of core material.

The composite wires of the present invention possess the desired modulus, strength and conductivities required for semiconductor packaging, and at the same time provide a cost advantage. Therefore, according to another aspect of the present invention, a semiconductor package is provided having at least one lead bonded to the second composite wire of the present invention. Composite wires having diameters as small as 25 microns have been wedge-bonded without disrupting the continuity of the noble metal outer layer, which is necessary in order to avoid oxidation of the non-noble metal core.

The composite wires of the present invention may be employed in other end-use applications for fine wire. Such applications include, but are not limited to, wires or cabled wires for jewelry, cathodic protection, or for harsh environments. The foregoing and other objects, features, and advantages of the present invention are more readily apparent from the detailed description of the preferred embodiments set forth below, taken in conjunction with the accompanying drawings.

DETAILED DESCRIPTION OF THE PREFERRED EMBODIMENTS

Figure 1:
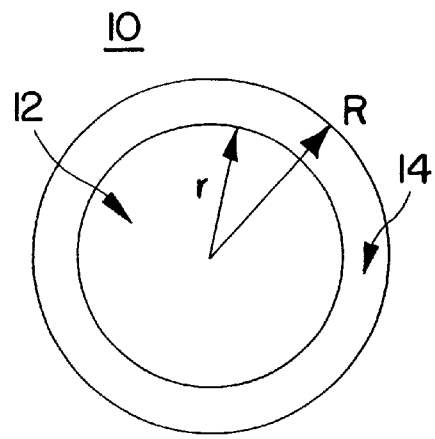
FIG. 1 is a cross-sectional view of a composite wire in accordance with one embodiment of the invention.

A composite wire, in accordance with one embodiment of the present invention, is depicted in FIG. 1, in which core 12 containing a non-noble metal is metallurgically bonded to noble metal annulus 14. (Noble metals are defined as metals that do not oxidize by heating in air, and, in addition to gold, include platinum, palladium, silver and the like. R represents the radius of the wire 10 formed by the core 12 and annulus 14, while r represents the radius of core 12. The amount of the core material 12 relative to annulus 14 and wire 10 is expressed as the "core fraction" measured by cross-sectional area, and this is a function of the ratio of r to R (r/R)

For purposes of the present invention, a metallurgical bond is defined as a bond formed by the application of heat and pressure. The amount of heat and pressure to employ depends upon the non-noble core metal or metal alloy and the noble metal or metal alloy annulus materials employed, and can be readily determined by one ordinarily skilled in metallurgy without undue experimentation. For example, for a copper or copper alloy core and a gold or gold alloy annulus a temperature greater than about 200° C. and a pressure greater than about 50 kg/mm² should be employed.

Figure 2:
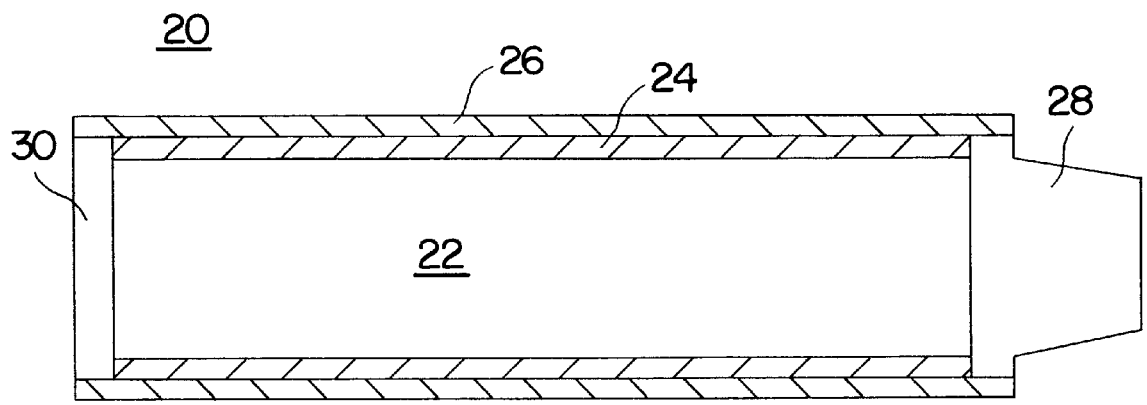
FIG. 2 is a side, cross-sectional view of a composite billet in accordance with one embodiment of the invention, which is extruded to form the composite rod from which the composite wires of the present invention are drawn.

The wire is formed by drawing a composite rod formed by extruding the composite billet 20 of FIG. 2. For example, a core-metal cylinder 22 containing copper is encased in gold in the form of a sleeve or wrapped sheets forming intermediate layer 24. This assembly is placed in a copper extrusion can 26 with end caps 28 and 30, and the resulting billet 20 is welded, evacuated, and sealed. The billet is preheated to a temperature between about 200° and about 700° C., and more preferably to a temperature between about 400° and about 500° C., and extruded by direct extrusion with a force/unit area between about 50 and about 200 kg/mm², and more preferably between about 100 and about 150 kg/mm², to form an extruded composite cylindrical rod having a diameter suitable for wire-drawing.

The extruded rod is cropped, cleaned, and drawn by conventional single die drawing to form a composite wire having a diameter between about 0.5 and about 5 millimeters, and preferably less than about 3 millimeters. The outer layer formed by the extrusion can is removed, preferably by etching, resulting in a coil of a gold-clad composite wire having a copper core, which is further drawn to a diameter less than 100 microns and preferably between about 15 and about 75, microns by standard bonding wire process technology. The core fraction by cross-sectional area is relatively unchanged from the original composite billet, so that the core fraction of the wire product is controlled by the billet design.

Preferred billets are between 25 and 100 mm diameter, which permits economical extrusion. The relative sizes of the core, noble metal layer and outer layer scale with the billet size, i.e., the dimensions are selected to obtain the core fraction desired for the composite wire to be produced. The extrusion can is about 10 to 20% of the entire billet cross section. The cylinder within that can defined by the non-noble metal core and the intermediate noble metal layer has a core fraction of between about 25 and about 95% by cross-sectional area, and most preferably has a core fraction of between about 50 to about 90%.

The extrusion reduction ratio (cross-sectional area of the billet divided by the cross-sectional area of the extruded rod) is preferably between about 10 and about 100, and most preferably between about 15 and about 50. The cylindrical rods extruded from the billet therefore have a diameters between about 2 and about 25 millimeters. The cylindrical rods are preferably extruded to diameters between about 4 and about 20 millimeters. The rods will have the same core fraction as the billets from which they are extruded.

To meet the anticipated future modulus requirements of the semiconductor industry, the non-noble metal 12 or wire 10 formed from core cylinder 22 of billet 20 preferably has an elastic modulus greater than about 95 GPa. Suitable core materials thus include the metals copper, nickel, and the like, and alloys thereof. The core material more preferably is a metal or metal alloy with high conductivity and high drawability. Thus, the core material is most preferably copper or a copper alloy, which also possess a significant cost advantage.

The core material for wedge bonding is preferably oxygen-free, high purity copper (OFHC). For ball bonding, the core material preferably has a melting point within 5° C. of the melting point of the annulus metal. For a gold or a gold alloy annulus, the core material is preferably a copper alloy with this melting point. More preferably, the copper alloy will also have improved oxidation resistance over that of pure copper. Preferred gold-clad, copper-cored composite wires have a resistivity between about 1.70 and about 2.00 $\mu$Ohm-cm, a modulus between about 95 and about 120 GPa, and a composite density between about 9.0 and about 15.0 g/cc. Each characteristic represents an improvement over 4N gold wire.

As noted above, the noble metal forming the annulus 14 metallurgically bonded to the non-noble metal-containing core 12 is preferably gold having a purity of at least 90%, preferably at least 99%, and most preferably at least 99.99%. The gold is preferably an alloy that is doped to obtain sound deformation of the composite and good bonding properties for the composite wire. A preferred gold alloy is doped with less than 30 ppm of calcium, less than 20 ppm of beryllium and less than 50 ppm of other elements. Gold alloys containing less than 10 ppm of calcium and less than 10 ppm of beryllium are even more preferred. A particularly preferred gold alloy is 4N gold, and a 4N gold nominally containing 7.5 ppm beryllium, 6.5 ppm calcium and less than 30 ppm of other elements is most preferred.

Figure 3:
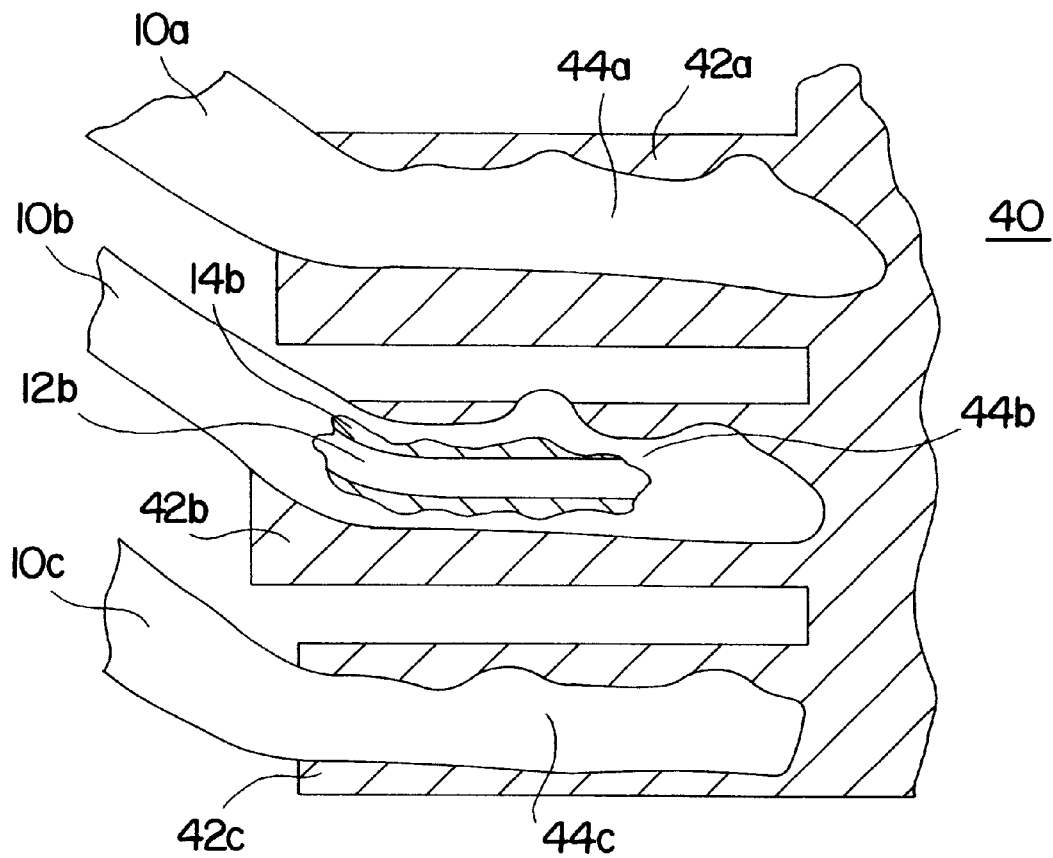
FIG. 3 is perspective view of a semiconductor package in accordance with one embodiment of the invention, depicting a lead bonded to a composite wire of the invention.

The composite wires of the present invention may be bonded to the leads of semiconductor packages by essentially conventional techniques. FIG. 3 depicts a semiconductor package 40 in which leads 42a, 42b, 42c, etc. are bonded to wires 10a, 10b, 10c, etc. by wedge bonds 44a, 44b, 44c, etc. A cut away view of wire 10b depicts case 12b surrounded by annulus 14b.

The present invention thus provides a composite bonding wire with a higher modulus, higher strength, and higher conductivity than standard 4N gold alloy bonding wire. The composite bonding wire noble metal content is nominally half that of conventional wire, so that the composite wire is significantly less expensive than the equivalent size 4N gold alloy wire, yet the composite wire maintains the standard 4N gold alloy bonding characteristics.

The following non-limiting example set forth hereinbelow illustrates certain aspects of the invention. All parts and percentages are by weight unless otherwise noted, and all temperatures are in degree Celsius.

EXAMPLE 800 g AW-14 (American Fine Wire, Ltd., Willow Grove, Pa.), a 4N gold alloy containing less than 10 ppm of Ca and Be, and less than 20 ppm each of In and Ge was cast into a 28 mm diameter mold. The casting process was a conventional batch casting consisting of melting the alloy in a graphite crucible and pouring the melt into a cylindrical graphite mold.

The resulting gold ingot was bored to form an 18 mm inside diameter (ID) center hole and machined to 25 mm outside diameter (OD). The resulting tube was machined to 76 mm length. A cylinder of OFHC grade copper was machined into a cylinder of 18 mm OD and 76 mm length. The copper cylinder fit inside the gold alloy tube with a tolerance of less than 1.0 mm.

A sleeve of OFHC copper was made with an ID of 25 mm, an OD of 28 mm, and a length of about 85 mm. Billet end caps were machined to fit the ends of the copper sleeve.

The billet caps were then electron-beam welded to seal the billet. The billet was preheated for one hour at 450° C. The heated billet was placed into a 50 ton extrusion press which was also preheated to 450° C. The billet was extruded to 6.4 mm diameter at a nominal run force of 48 tons.

The extrudate was cleaned with an abrasive pad and washed in water. The billet nose and tail were cropped off, and samples were taken. The resulting rod was drawn to 1 mm diameter by conventional single-die drawing. The resulting wire was placed in 50% nitric acid in water to chemically remove the copper sheath originating from the extrusion can. The etched wire was rinsed with water, then with alcohol.

The wire was further etched in aqua regia (1 part nitric acid, 3 parts hydrochloric acid, and 4 parts water) for about ten seconds to remove any gold-copper compounds on the surface of the wire. The resulting wire was drawn to nominally 25 micron diameter using a standard 8 to 12% reduction die schedule on standard multi-die drawing machines using oil-in-water emulsion lubricant. Wire drawability was excellent, with lengths greater than 5 kilometers drawn without breaking.

Figure 5:
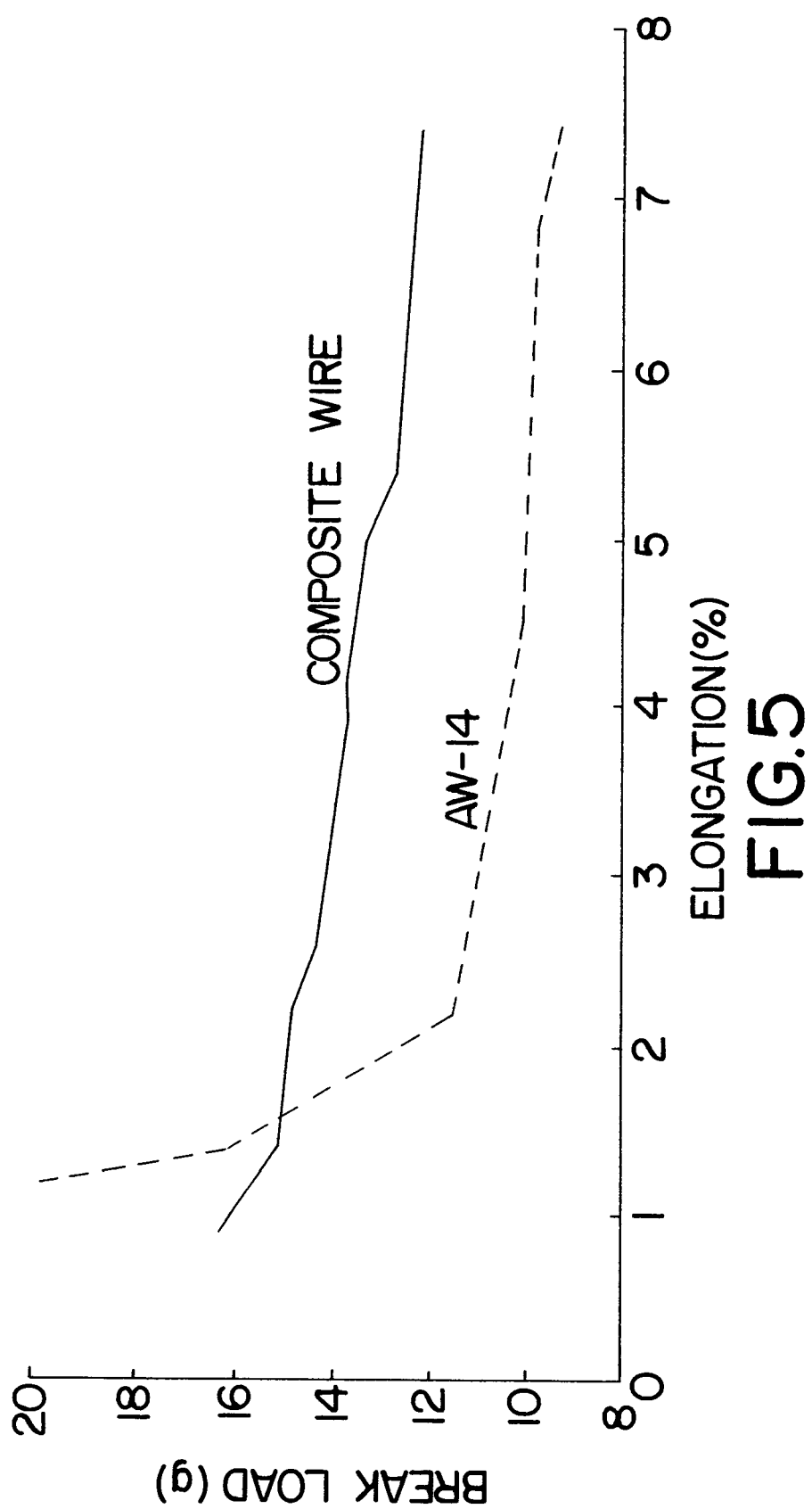
FIG. 5 is a comparison of the elongation vs. break load properties of a composite gold wire in accordance with one embodiment of the present invention to AW-14 gold wire (a type of 4N gold alloy).

The elongation and break-load properties of the composite wire were measured. As depicted in FIG. 5, the 24.8 micron diameter composite wire was about 20% stronger than AW-14 gold alloy for elongations above 2% (bonding wire specifications are >2% elongation for most applications), breaking at about 14 g @4% elongation. The copper core was very uniform along the axis of the wire. At the final wire diameter of 24.8 microns, the standard deviation of the copper core cross section was only 0.26%.

The modulus of the composite wire was about 108 GPa when annealed, about 26% higher than AW-14. The resistivity of the composite wire was 2.0 micro-ohms-cm, which is about 12% lower than that of AW-14. Measurement of the resistivity versus time and temperature of the composite wire shows negligible resistivity increase up to 500 hours at temperatures less than or equal to 200° C.

Figure 4:
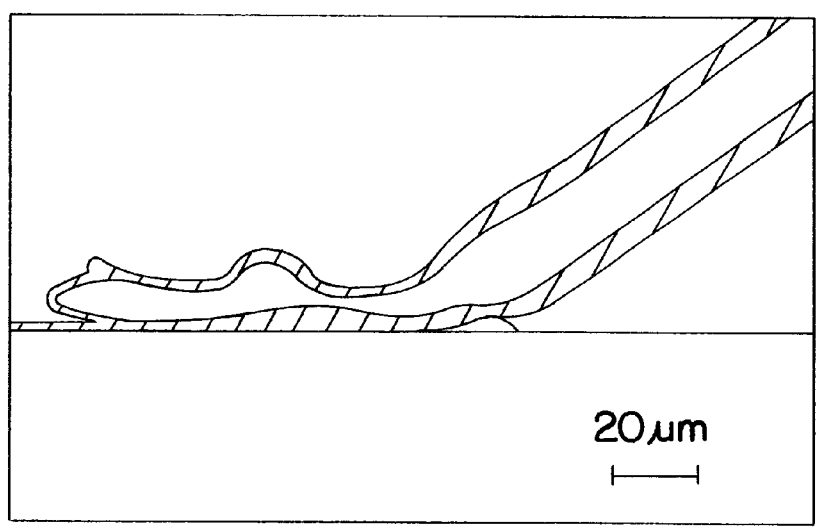
FIG. 4 is a longitudinal, cross-sectional SEM micrograph of a composite gold wire in accordance with one embodiment of the invention, wedge-bonded to a lead of a semiconductor package.

Initial wedge bonding trials on the 24.8 micron composite wires showed strong bonding. A SEM micrograph cross-section of a semiconductor package wedge-bonded with the composite wire is shown in FIG. 4. Continuity of the gold sheath within the wedge bond is maintained.

The present invention thus provides a strong, flexible composite wire suitable for bonding wire applications having a non-noble metal core ensheathed in a uniform, metallurgically-bonded noble metal annulus. By using copper or copper alloy as the core material, a composite wire is obtained having optimum modulus, strength and conductivity, as well as significantly reduced cost.

The foregoing example and description of the preferred embodiments should be taken as illustrating, rather than as limiting, the present invention as defined by the claims. Numerous variations and combinations of the features set forth above can be utilized without departing from the presently-claimed invention. Such variations should not be regarded as a departure from the spirit and scope of the invention, and are intended to be included within the scope of the following claims.

What is claimed is:

1. A composite wire drawn from a co-extrudate having a diameter greater than about 15 microns and less than about 100 microns, and consisting essentially of a 4N gold alloy annulus surrounding a wire core comprising an electrically-conductive, non-noble metal, said composite wire having one or more of the following properties:

(a) a resistivity between about 1.70 and about 2.00$\mu$ ohm cm;

(b) a modulus between about 95 and about 120 GPa; and (c) a composite density between about 9.0 and about 15.0 g/cc.

2. The composite wire of claim 1, wherein said core metal comprises copper.

3. The composite wire of claim 2, wherein said core metal consists essentially of copper.

4. The composite wire of claim 1, having a core fraction between about 25% and about 95% by cross-sectional area.

5. The composite wire of claim 1, having a diameter between about 15 and about 75 microns.

6. The composite wire of claim 1, wherein said 4N gold alloy is doped with less than 30 ppm of calcium, less than 20 ppm of beryllium, and less than 50 ppm of other elements.

7. The composite wire of claim 6, wherein said 4N gold alloy comprises less than 10 ppm of beryllium and less than 10 ppm of calcium.

8. The composite wire of claim 1, wherein said core metal and said 4N gold alloy have melting temperatures within a range of 5° C.

9. The composite wire of claim 1, having an elastic modulus greater than about 95 GPa.

10. A semiconductor package comprising at least one lead bonded to the composite wire of claim 1.

11. The semiconductor package of claim 10, wherein said lead is wedge-bonded to said composite wire.

12. The semiconductor package of claim 11, wherein the core of said composite wire consists essentially of copper.

* * * * *